(12) United States Patent
Liu et al.

(10) Patent No.: US 12,074,033 B2
(45) Date of Patent: Aug. 27, 2024

(54) PLASMA PROCESSING METHOD

(71) Applicant: Hitachi High-Tech Corporation, Tokyo (JP)

(72) Inventors: Chaomei Liu, Tokyo (JP); Hitoshi Kobayashi, Tokyo (JP); Masahito Mori, Tokyo (JP); Ryota Takahashi, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 180 days.

(21) Appl. No.: 17/439,765

(22) PCT Filed: Dec. 23, 2020

(86) PCT No.: PCT/JP2020/048095
§ 371 (c)(1),
(2) Date: Sep. 15, 2021

(87) PCT Pub. No.: WO2021/171764
PCT Pub. Date: Sep. 2, 2021

(65) Prior Publication Data
US 2022/0392772 A1 Dec. 8, 2022

(30) Foreign Application Priority Data

Feb. 27, 2020 (WO) .................. PCT/JP2020/007939

(51) Int. Cl.
*H01L 21/311* (2006.01)
*H01J 37/32* (2006.01)
*H01L 21/02* (2006.01)

(52) U.S. Cl.
CPC .. *H01L 21/31116* (2013.01); *H01J 37/32174* (2013.01); *H01L 21/02129* (2013.01); *H01L 21/31144* (2013.01); *H01J 2237/334* (2013.01)

(58) Field of Classification Search
None
See application file for complete search history.

(56) References Cited

U.S. PATENT DOCUMENTS 5,112,435 A     5/1992   Wang et al.
6,037,265 A  *   3/2000   Mui ....................... C09K 13/00
                                                                                                         438/719

(Continued)

FOREIGN PATENT DOCUMENTS

CN        104364886 A      2/2015
JP         S62176134 A      8/1987

(Continued)

OTHER PUBLICATIONS

Office Action mailed Mar. 20, 2023 in Taiwanese Application No. 110106613.

(Continued)

*Primary Examiner* — Roberts P Culbert
(74) *Attorney, Agent, or Firm* — Miles & Stockbridge, P.C.

(57) ABSTRACT

In a plasma processing method for plasma etching a silicon film or polysilicon film containing boron, the polysilicon film containing boron is etched by using a mixed gas of a halogen gas, a fluorine-containing gas, and a boron trichloride gas. According to plasma processing method, it is possible to improve the etching rate and reduce etching defects when plasma etching a silicon film or polysilicon film containing boron.

19 Claims, 5 Drawing Sheets

(56) References Cited

U.S. PATENT DOCUMENTS

| | | |
|---|---|---|
| 6,063,710 A | 5/2000 | Kadomura et al. |
| 8,969,211 B2 | 3/2015 | Muto et al. |
| 9,230,824 B2 | 1/2016 | Takayama et al. |
| 9,337,056 B2 | 5/2016 | Takahashi et al. |
| 9,412,617 B2 | 8/2016 | Narishige et al. |
| 10,121,640 B2 | 11/2018 | Muto et al. |
| 2002/0125207 A1 | 9/2002 | Ono et al. |
| 2005/0023592 A1 | 2/2005 | Sasaki et al. |
| 2006/0011580 A1 | 1/2006 | Shimizu |
| 2011/0223769 A1 | 9/2011 | Ko et al. |
| 2013/0157427 A1 | 6/2013 | Cho et al. |
| 2013/0244394 A1 | 9/2013 | Kim et al. |
| 2014/0057442 A1 | 2/2014 | Lee et al. |
| 2014/0299571 A1 | 10/2014 | Sawataishi |
| 2014/0302682 A1 | 10/2014 | Muto et al. |
| 2015/0004795 A1 | 1/2015 | Ishii |
| 2015/0170880 A1 | 6/2015 | Muto et al. |
| 2015/0179466 A1 | 6/2015 | Takayama et al. |
| 2015/0221518 A1 | 8/2015 | Terakura et al. |
| 2015/0228500 A1 | 8/2015 | Ogawa et al. |
| 2015/0303069 A1 | 10/2015 | Narishige et al. |
| 2015/0332932 A1 | 11/2015 | Hirotsu et al. |
| 2016/0042918 A1 | 2/2016 | Saitoh et al. |
| 2018/0204728 A1 | 7/2018 | Oomori et al. |
| 2018/0226464 A1 | 8/2018 | Kim et al. |
| 2019/0043732 A1 | 2/2019 | Eason et al. |
| 2019/0131125 A1 | 5/2019 | Yamaguchi |
| 2020/0227270 A1 | 7/2020 | Iwase et al. |
| 2021/0082709 A1 | 3/2021 | Tomura et al. |

FOREIGN PATENT DOCUMENTS

| | | |
|---|---|---|
| JP | H09298192 A | 11/1997 |
| JP | H11297679 A | 10/1999 |
| JP | 2001085395 A | 3/2001 |
| JP | 2005050917 A | 2/2005 |
| JP | 2005203612 A | 7/2005 |
| JP | 2011192776 A | 9/2011 |
| JP | 2014203912 A | 10/2014 |
| JP | 2015012178 A | 1/2015 |
| JP | 2015119099 A | 6/2015 |
| JP | 2015144158 A | 8/2015 |
| JP | 2016039309 A | 3/2016 |
| JP | 2017050529 A | 3/2017 |
| JP | 2017103388 A | 6/2017 |
| JP | 2019080000 A | 5/2019 |
| TW | 201331343 A | 8/2013 |
| TW | 201419400 A | 5/2014 |
| TW | 201440111 A | 10/2014 |
| TW | 201921484 A | 6/2019 |
| TW | 202004908 A | 1/2020 |
| WO | 2019138654 A1 | 7/2019 |

OTHER PUBLICATIONS

Office Action mailed Apr. 23, 2023 in Chinese Application No. 202080012015.3.
Office Action mailed Jan. 4, 2022 in U.S. Appl. No. 16/482,106.
Search Report mailed Jan. 26, 2021 in International Application No. PCT/JP2020/048095.
Written Opinion mailed Jan. 26, 2021 in International Application No. PCT/JP2020/048095.
Office Action mailed Jun. 4, 2021 in Taiwanese Application No. 110106613.
International Preliminary Examination Report and Applicant's Written Response filed May 12, 2021 in International Application No. PCT/JP2020/048095.
Search Report mailed Dec. 18, 2018 in International Application No. PCT/JP2018/039866.

* cited by examiner

[FIG. 1]
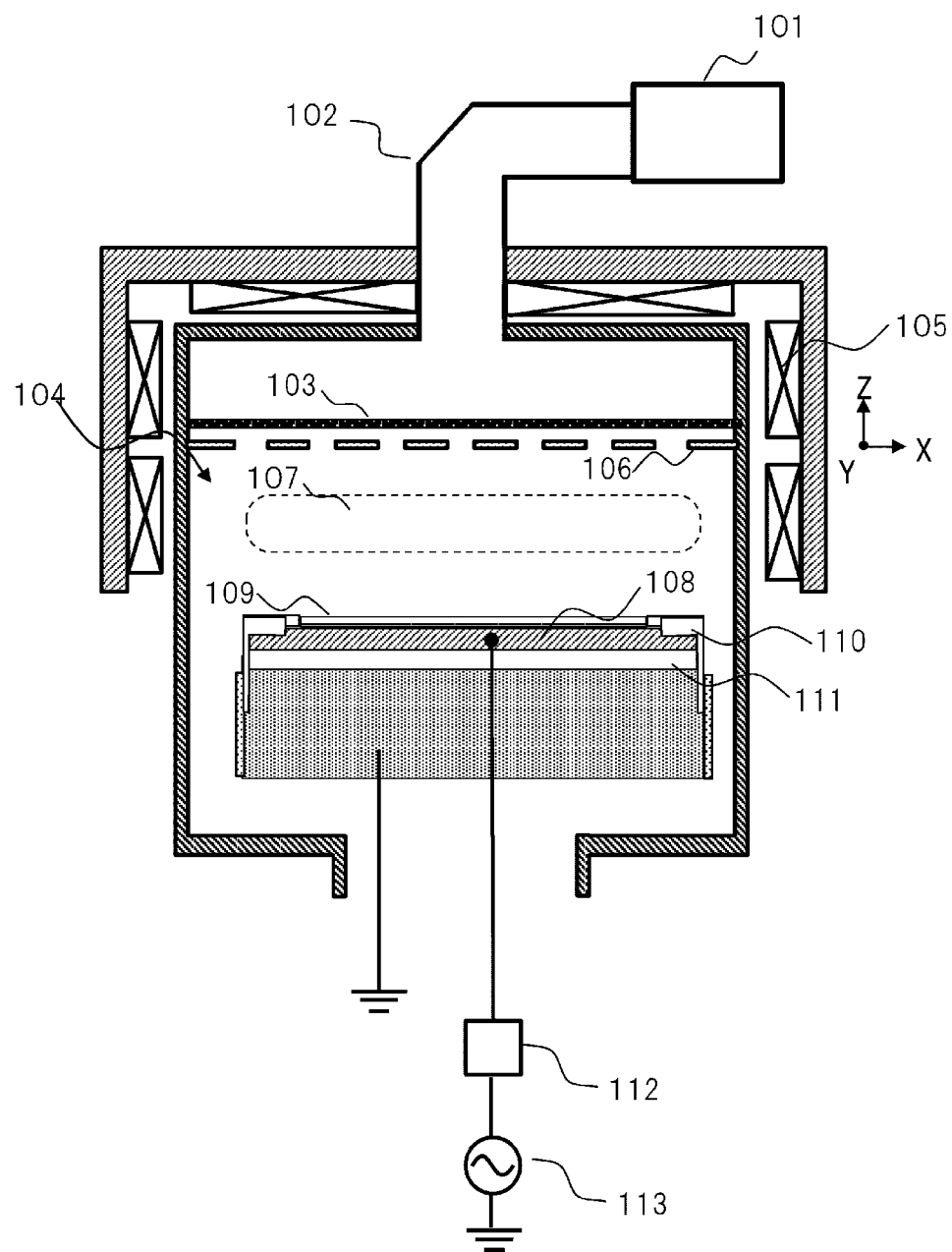

[FIG. 2A]
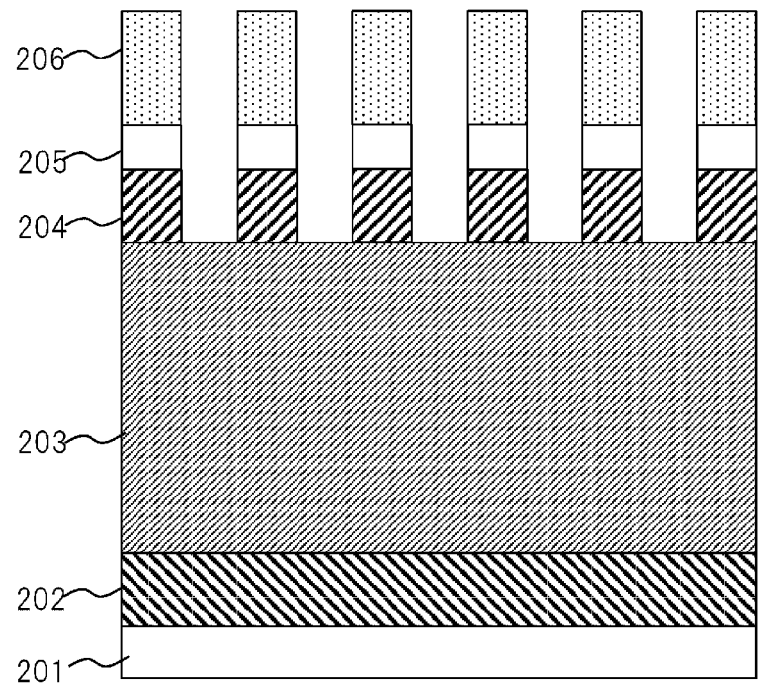
[FIG. 2B]
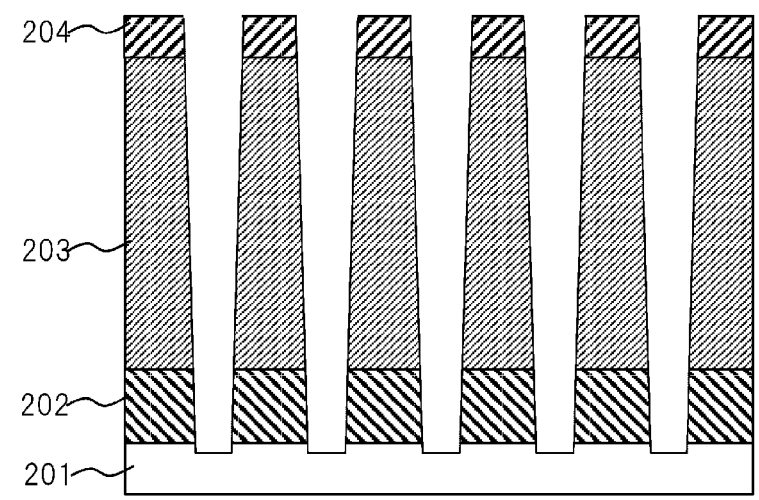

[FIG. 3A]
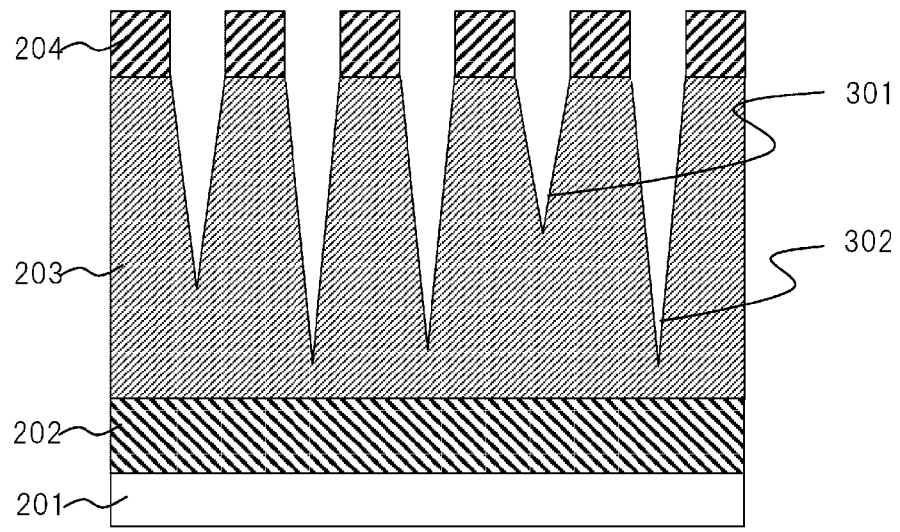
[FIG. 3B]
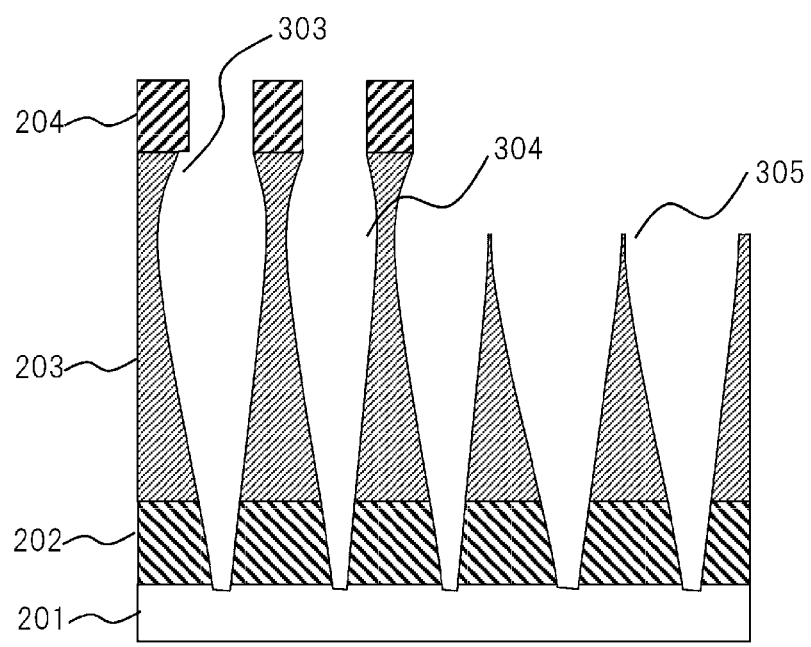

[FIG. 4A]
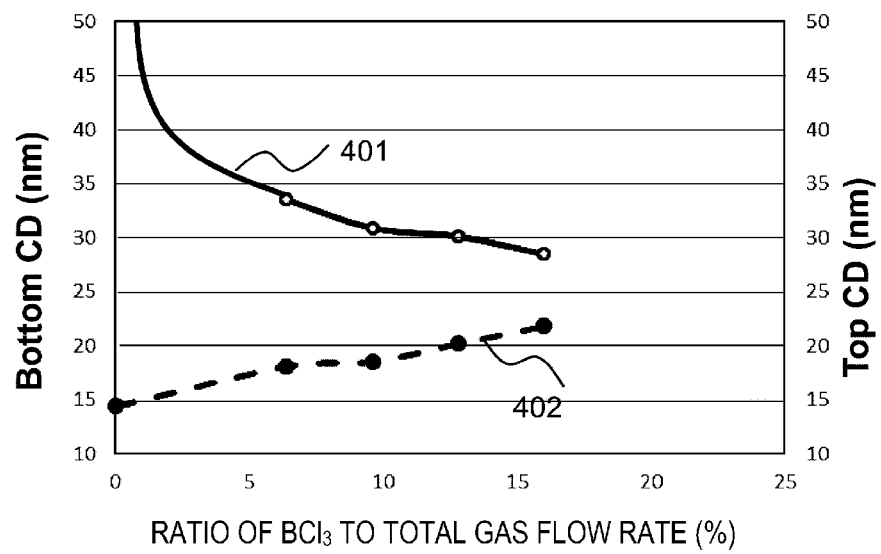
[FIG. 4B]
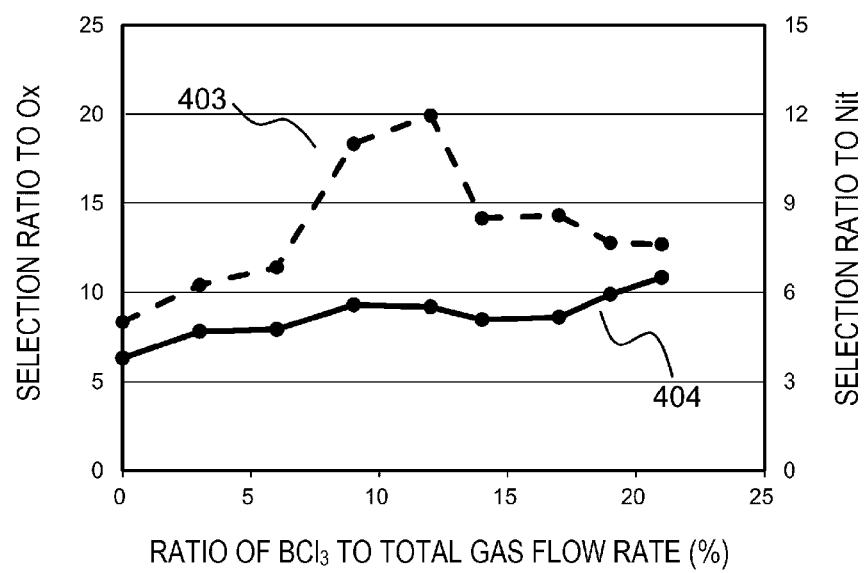

[FIG. 5]
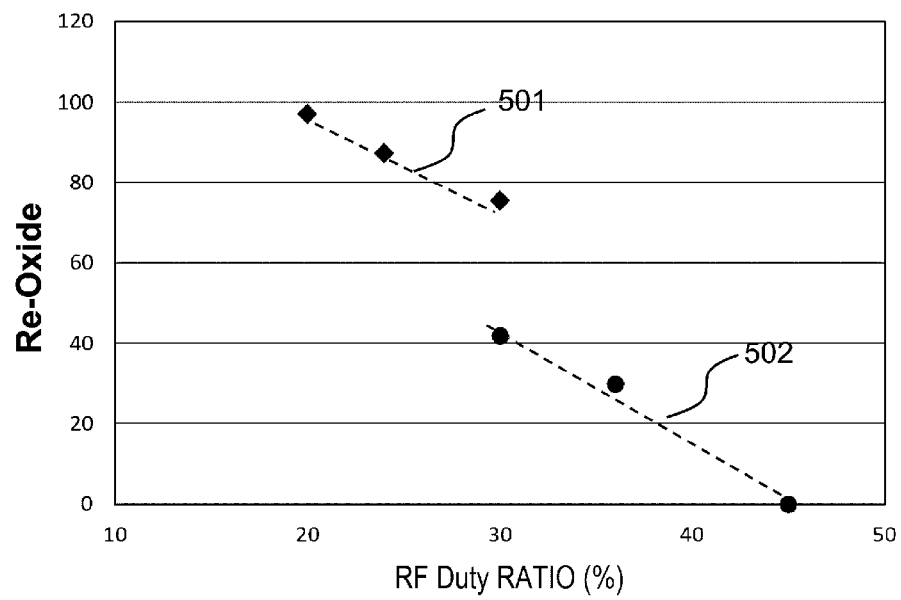
[FIG. 6]
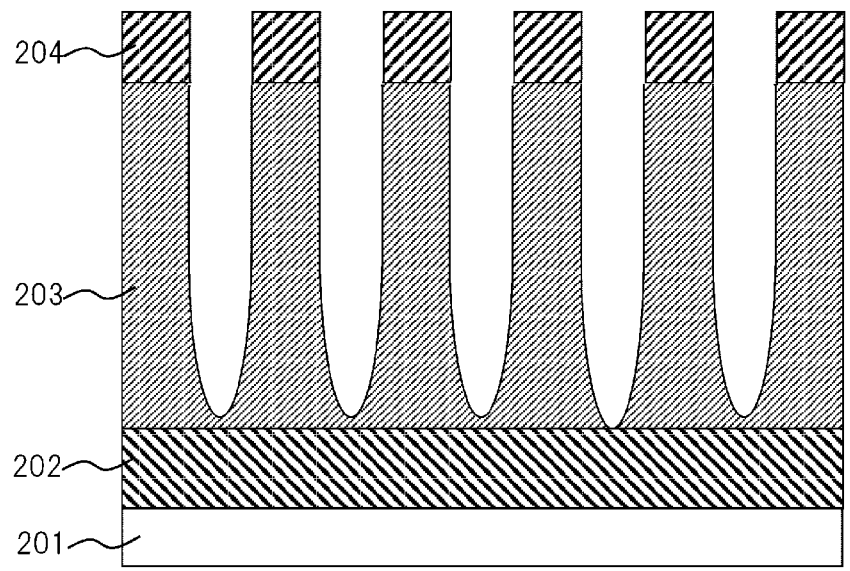

PLASMA PROCESSING METHOD

TECHNICAL FIELD

The present invention relates to a plasma processing method.

BACKGROUND ART

In a manufacturing process of a semiconductor device, it is required to achieve process shrink and integration of components included in the semiconductor device. For example, nanoscale of a structure is further promoted in an integrated circuit and a nano-electromechanical system.

Generally, in the manufacturing process of the semiconductor device, a lithography technique is used to form micropatterns. In this technique, a pattern of a device structure is applied on a resist layer, and a substrate exposed by the pattern of the resist layer is selectively removed by etching. In a subsequent processing step, it is possible to form the integrated circuit by depositing other materials in an etched region.

In recent years, as memory devices such as Flash and DRAM have become highly integrated and speeded up, etching capability of forming a pattern structure having a high aspect ratio is required. In the related art, polysilicon is chosen to be used as hard mask material to etch an insulating film of several micrometers. However, because of the limited selectivity with an insulating film and the concerns about further thickening of the film, the application of boron-doped polysilicon as an etching-resistant material has been studied. For example, PTL 1 discloses that boron-doped polysilicon is used as one of the hard mask materials. Further, PTL 2 discloses that a mixed gas of chlorine and bromine is used as a technique for etching using the polysilicon or doped polysilicon in the related art.

CITATION LIST

Patent Literature

PTL 1: US Patent Application Publication NO. 2014/0057442 specification
PTL 2: US Patent Application Publication NO. 2013/0244394 specification
PTL 3: JP-A-2019-80000 specification

SUMMARY OF INVENTION

Technical Problem

However, when boron-doped polysilicon, which is an etching-resistant material, is etched under etching conditions in the related art, there are problems of causing etching defects such as etching stop (etching failure) and taper shape formation accompanied with a decrease in the etching rate. Further, when boron-doped polysilicon is etched with a fluorine gas, there are problems of causing etching defects such as side etching (undercut) and bowing shape formation. Further, PTL 3 discloses that a boron (B) containing silicon film is used as a mask film. However, there is no specific description in PTL 3 about how to etch the mask film of the boron (B) containing silicon.

In view of the technical problems of the related art, an object of the invention is to provide a plasma processing method that improves the etching rate and reduces etching defects when plasma etching a silicon film or polysilicon film containing boron.

Solution to Problem

In order to solve the above-mentioned technical problems, a typical method of plasma processing methods according to the invention is achieved by a plasma processing method for plasma etching a silicon film containing boron, the plasma processing method includes: etching the silicon film containing boron by using a mixed gas of a halogen gas, a fluorine-containing gas, and a boron trichloride gas.

Furthermore, another typical method of the plasma processing methods according to the invention is achieved by a plasma processing method for plasma etching a silicon film containing boron, the plasma processing method includes: etching the silicon film containing boron by using a chlorine gas, a nitrogen trifluoride gas, a boron trichloride gas, and an oxygen gas.

Furthermore, another typical method of the plasma processing methods according to the invention is achieved by a plasma processing method for plasma etching a silicon film containing boron, the plasma processing method includes: etching the silicon film containing boron by using a chlorine gas, a nitrogen trifluoride gas, a boron trichloride gas, an oxygen gas, and a hydrogen bromide gas.

Furthermore, another typical method of the plasma processing methods according to the invention is achieved by a plasma processing method for plasma etching a polysilicon film containing boron, the plasma processing method includes: etching the polysilicon film containing boron by using a mixed gas of a halogen gas, a fluorine-containing gas, and a boron trichloride gas, in which the halogen gas is at least one of a hydrogen bromide gas, a hydrogen chloride gas, and a hydrogen iodide gas.

Furthermore, another typical method of the plasma processing methods according to the invention is achieved by a plasma processing method for plasma etching a polysilicon film containing boron, the plasma processing method includes: etching the polysilicon film containing boron by using a chlorine gas, a nitrogen trifluoride gas, a boron trichloride gas, and an oxygen gas.

Furthermore, another typical method of the plasma processing methods according to the invention is achieved by a plasma processing method for plasma etching a polysilicon film containing boron, the plasma processing method includes: etching the polysilicon film containing boron by using a chlorine gas, a nitrogen trifluoride gas, a boron trichloride gas, an oxygen gas, and a hydrogen bromide gas.

Advantageous Effect

According to the invention, a plasma processing method that improves the etching rate and reduces etching defects when plasma etching a silicon film or polysilicon film containing boron is provided. Technical problems, configurations and other effects than those described above will be clarified by the description of the following embodiments.

BRIEF DESCRIPTION OF DRAWINGS

FIG. 1 is a schematic cross-sectional view of a plasma etching device according to the present embodiment.

FIG. 2A is a schematic cross-sectional view of a material to be etched before a plasma etching process according to the present embodiment.

FIG. 2B is a schematic cross-sectional view of the material to be etched after the plasma etching process according to the present embodiment.

FIG. 3A is a schematic view of a processed cross section of a material to be etched showing a shape abnormality, and is a diagram showing an example of an etching stop or the like.

FIG. 3B is a schematic view of a processed cross section of a material to be etched showing a shape abnormality, and is a diagram showing an example of side etching and the like.

FIG. 4A is a graph showing a relation between a ratio of a flow rate of $BCl_3$ gas in an etching gas and an opening size.

FIG. 4B is a graph showing a relation between the ratio of the flow rate of $BCl_3$ gas and a selection ratio to a silicon nitride film and a silicon oxide film.

FIG. 5 is a graph showing a relation between a remaining film amount of silicon oxide film and a duty ratio (%) of TM bias.

FIG. 6 is a diagram showing a cross-sectional shape of a material to be etched when a processing pressure is 2 Pa or less.

DESCRIPTION OF EMBODIMENTS

FIG. 1 is a schematic vertical sectional view showing a microwave electron cyclotron resonance (ECR) plasma type etching processing device used in the present embodiment. A 2.45 GHz microwave oscillated by a power supply 101 propagates through a waveguide 102, passes through a dielectric window 103, and is supplied to a processing chamber 104. The etching processing gas is supplied to the processing chamber 104 from a shower plate 106 having a plurality of through holes. A plurality of solenoid coils 105 are arranged on the outer circumference of the processing chamber 104 and above the dielectric window 103, and a desired magnetic field is generated by controlling a current value of the solenoid coils 105. Further, the electron cyclotron resonates due to the interaction between the microwave and the magnetic field, so that the etching processing gas supplied to the processing chamber 104 is excited, and a high-density plasma 107 is generated. Etching a material to be etched using this high-density plasma 107 is called plasma etching.

A wafer 109 having the material to be etched is placed on the upper surface of a sample table 108 housed in the processing chamber 104. The sample table 108 has a quartz susceptor ring 110 arranged on the outer peripheral side and an insulating plate 111 arranged below the susceptor ring 110. In order to perform anisotropic etching on the wafer 109 filmed on the wafer 109 according to an exposure pattern, a matcher 112 and a radio frequency power supply 113 are provided in a lower part of the sample table 108, and a mechanism for controlling the energy of ions incident from the plasma is provided. Further, the radio frequency power supply 113 has a mode of continuous bias on [continuous wave bias (hereinafter, referred to as CW bias)], and a mode of time modulation [Time Modulation Bias (hereinafter, referred to as TM Bias)] in which bias on and bias off are periodically repeated in the order of milliseconds.

FIG. 2A shows a cross-sectional structure of a semiconductor wafer to which a plasma processing method according to the present embodiment is applied by using the etching processing device shown in FIG. 1. The semiconductor wafer has a multilayer structure including a silicon nitride film 201, a polysilicon 202, a boron-doped polysilicon (polysilicon film containing boron) 203 which is boron-doped, a silicon oxide film 204, an amorphous carbon film 205, and a patterned photoresist film 206 in the order from the bottom in the drawing. Further, a silicon oxide film having a size of about 1.2 micrometers is present in a lower layer of the silicon nitride film 201 (not shown in FIG. 2A).

First, in order to transfer the hole pattern to the silicon oxide film 204, the amorphous carbon film 205 and the silicon oxide film 204 are etched to obtain an initial shape shown in FIG. 2A. Then, the boron-doped polysilicon 203 and the polysilicon 202 are etched.

In the present embodiment, the circuit pattern is transferred (etched) to the polysilicon 202 and the boron-doped polysilicon 203, which are hard masks for etching the silicon oxide film having a size of about 1.2 micrometers. A film to be etched, which includes the boron-doped polysilicon 203 and the polysilicon 202, has a thickness of about 800 nm, and the boron-doped polysilicon 203 has a film thickness of 200 nm to 600 nm. Moreover, a thickness ratio of boron-doped polysilicon 203 and the polysilicon 202 is appropriately changed depending on the purpose.

In the related art, a mixed gas of halogen gases $Cl_2$ and $O_2$ is used in etching the polysilicon 202 in order to form a hole shape in the boron-doped polysilicon 203 and the polysilicon 202. When using this polysilicon etching condition in the related art, an etching rate of boron-doped polysilicon is 50% or more lower than that of polysilicon, which brings about a problem of causing shape defects such as etching stop 301 and taper shape 302 as shown in FIG. 3A.

On the other hand, in order to avoid the etching stop 301, when the boron-doped polysilicon 203 is etched with a fluorine-containing gas, a side wall protective film becomes thinner, which brings about a problem of causing shape defects such as side etching 303, bowing shape 304, and pattern disappearance 305 as shown in FIG. 3B. Further, since the boron-doped polysilicon 203, which is the film to be etched, is thicker than the hole, ions and radicals do not sufficiently reach a lower end (bottom) portion of a micro shape, and it is difficult to expand the bottom size. The fluorine-containing gas is a gas such as $NF_3$ gas, $SF_6$ gas, or HF gas.

In order to solve such a problem, in the present embodiment, a mixed gas of $Cl_2$ gas which is a halogen gas, $NF_3$ gas which is a fluorine-containing gas, $O_2$ gas, and $BCl_3$ gas, is supplied to the processing chamber 104 and used. A schematic view of the cross-sectional structure of the semiconductor wafer processed by this plasma processing method is shown in FIG. 2B. By using this mixed gas, it is possible to etch the boron-doped polysilicon while a boron-based deposit (hereinafter, abbreviated as deposit) protects the side wall. Further, the effect of using $BCl_3$ gas will be described with reference to FIGS. 4A and 4B. Here, as the halogen gas, any one or more of $Cl_2$ gas, HBr gas, HCl gas, and HI gas can be used. For example, it is also possible to solve the above-mentioned problem by using a mixed gas of $Cl_2$ gas, HBr gas, $NF_3$ gas, $O_2$ gas, and $BCl_3$ gas. In the case of using the mixed gas of $Cl_2$ gas, HBr gas, $NF_3$ gas, $O_2$ gas and $BCl_3$ gas, a selection ratio to the silicon oxide film can be further improved, and therefore, it is possible to prevent shoulder dropping and prevent the expansion of Top CD of the hole when etching the hole.

FIG. 4A is a graph showing a relation between a ratio of a flow rate of $BCl_3$ gas in the etching gas and an opening size (opening end: Top CD 401, bottom end: Bottom CD 402). The CD means critical dimension. Here, the etching device shown in FIG. 1 is used and the etching conditions are set that the pressure of the processing chamber 104 is 0.8 Pa, the microwave output of the power supply 101 is 600 W, the stage temperature of the sample table 108 is 50° C., $Cl_2$ is supplied at 80 ml/min, HBr is supplied at 140 ml/min, and $O_2$ is supplied at 20 ml/min as the etching gas supplied to the processing chamber 104. The etching processing time is constant under all conditions.

When the flow rate of $BCl_3$ gas is 0% of the total flow rate of the gas, side etching is excessive and pattern disappearance 305 of the Top portion occurs, the Top CD is infinite (immeasurable), and the Bottom CD is 14.3 nm. On the other hand, as the flow rate of $BCl_3$ gas is increased to 6.5% and 16%, due to the effect of the boron-based protective film, the pattern disappearance 305 of the Top portion is improved, the Top CD decreases to 33 nm and 28 nm, and the Bottom CD increases to 18 nm and 22 nm.

It is possible to obtain the results described above by the structure in which a BO deposit and a $BCl_X$ deposit generated from B and O radicals in the plasma form protective films on both walls of the hole, and the generation of side etching 303 and bowing shape 304 is prevented. Further, when the flow rate of $BCl_3$ gas increases, the BO deposit and the $BCl_X$ deposit adhere to the side wall, so that the opening size is reduced, but since the boron-based deposit does not consume the etchant on the side wall, it is possible to precede the etching to the inner part, and the Bottom CD increases. From the results described above, it can be considered that the opening size is controllable by adjusting the flow rate of $BCl_3$ gas with respect to the total flow rate of gas.

FIG. 4B is a graph showing the relation between the ratio of the flow rate of $BCl_3$ gas added in the etching gas in which $Cl_2$ is supplied at 80 ml/min, HBr is supplied at 140 ml/min, and $O_2$ is supplied at 20 ml/min under the conditions that the pressure of the processing chamber 104 is 0.8 Pa, the microwave output of the power supply 101 is 600 W, and the stage temperature of the sample table 108 is 50° C., and a selection ratio 404 to the silicon nitride film as well as a selection ratio 403 to the silicon oxide film.

When the flow rate ratio of $BCl_3$ gas increases from 0% to 12%, the selection ratio 403 to the silicon oxide film and the selection ratio 404 to the silicon nitride film increase, but when the $BCl_3$ gas is further added, the selection ratio 403 to the silicon oxide film decreases, while the silicon oxide film and the selection ratio 404 increases. Therefore, the addition of $BCl_3$ gas can increase merely the selection ratio 404 to the silicon nitride film.

In the etching conditions adopted in the present embodiment, in order to maximize the remaining film amount of the silicon oxide film 204, the flow rate setting of the $BCl_3$ gas is set at a ratio of 9% to 13% with respect to the total gas flow rate. Further, even under different etching conditions (pressure, microwave power, stage temperature, and the like), it is possible to obtain the pattern shape as shown in FIG. 2B with the same method by acquiring trend data of the selection ratio 403 to the silicon oxide film and the selection ratio 404 to the silicon nitride film with respect to the ratio of $BCl_3$ gas to the total gas flow rate, and appropriately performing adjustment to obtain a desired selection ratio and shape.

Furthermore, by adjusting the time modulation (TM) bias, it is possible to protect an upper pattern by depositing the product reacted at the bias off time on the side wall, and the selection ratio can be controlled. FIG. 5 is a graph showing a relation between the remaining film amount of silicon oxide film and a duty ratio (%) of TM bias. Moreover, the TM bias is a method of applying a bias to the sample table by supplying pulse-modulated radio frequency power to the sample table. In addition, the duty ratio is a ratio of the time when the radio frequency power is turned on to the TM bias time of one cycle. The effective power is the product of the bias power and the duty ratio (radio frequency power and duty ratio during the pulse-on period).

In both a regression line 501 indicating the remaining film amount due to the effective power of 90 W and a regression line 502 indicating the remaining film amount due to the effective power of 180 W, the remaining film amount of the silicon oxide film increases as the duty ratio decreases. Therefore, unless limited by the power characteristics of the radio frequency power supply 113 or the like, it is preferable to select TM bias conditions having a higher power and a lower duty ratio. In this case, since the ion assist reaction time is shortened due to the decrease in the duty ratio, other parameters such as the gas composition ratio, the pressure, and the microwave power may be adjusted in order to achieve compatibility with the etching shape. For example, when the target value of the oxide film remaining film is 80 nm or more, it is desirable to set the effective power to 90 W and the duty ratio to 25% or less.

Further, FIG. 6 shows a cross-sectional shape of a material to be etched when the etching is performed under a processing pressure set to 2 Pa or less. As the ion density of the etching gas increases and the residence time of the reaction product decreases by reducing the pressure in the processing chamber where the polysilicon film containing boron is plasma-etched, the ratio of etchants and ions reaching the bottom of the hole increases, so that the tapered shape is improved and a vertical shape is obtained. From this result, it is desirable to set the processing pressure to 2 Pa or less.

By appropriately adjusting the gas flow rate ratio of $Cl_2$, $NF_3$, $O_2$, $BCl_3$ or the gas flow rate ratio of $Cl_2$, $NF_3$, $O_2$, $BCl_3$, HBr and other parameters as described above, it is possible to improve the etching rate and obtain a desired shape while preventing the etching stop 301, the side etching 303, the bowing shape 304 and the pattern disappearance 305.

Further, even though the gases described above are diluted with an inert gas such as $N_2$, Ar, He, Xe, Kr gas, the same effect as that of the present embodiment can be obtained. Furthermore, the present embodiment can be similarly applied to plasma etching of a silicon film containing boron instead of the polysilicon film containing boron.

Further, in the present embodiment, the microwave ECR type etching processing device shown in FIG. 1 is used, but also in a plasma etching device using other plasma sources such as capacitive coupled plasma (CCP) type and inductively coupled plasma (ICP) type, the same effect can be obtained by adjusting the pressure, gas flow rate, gas ratio, bias power and frequency.

The embodiment described above has been described in detail for easy understanding of the invention, and the invention is not necessarily limited to include all the configurations described above. In addition, a part of the configuration of one embodiment can be replaced with the configuration of another embodiment, and the configuration of another embodiment can be added to the configuration of one embodiment. In addition, part of the configuration of each embodiment can be added, deleted, or replaced with other configurations.

REFERENCES SIGN LIST

101: electric field generation power supply
102: waveguide
103: dielectric window 104: processing chamber
105: solenoid coils
106: shower plate
107: high-density plasma
108: sample table
109: wafer
110: susceptor ring
111: insulator
112: matcher
113: radio frequency power supply
201: silicon nitride film
202: polysilicon
203: boron-doped polysilicon
204: silicon oxide film
205: amorphous carbon film
206: photoresist film
301: etching stop
302: taper shape
303: side etching
304: bowing shape
305: pattern disappearance
401: Top CD
402: Bottom CD
403: selection ratio to silicon oxide film
404: selection ratio to silicon nitride film
501: regression line indicating remaining film amount due to effective power of 90 W
502: regression line indicating remaining film amount due to effective power of 180 W

The invention claimed is:

1. A plasma processing method for plasma etching a silicon film containing boron, the plasma processing method comprising:
   etching the silicon film containing boron by using a mixed gas of a halogen gas, a fluorine-containing gas, and a boron trichloride gas.

2. The plasma processing method according to claim 1, wherein
   the halogen gas is at least one of chlorine gas, hydrogen bromide gas, hydrogen chloride gas, and hydrogen iodide gas.

3. The plasma processing method according to claim 1, wherein
   a flow rate ratio of the boron trichloride gas to a flow rate of the mixed gas is set to a ratio within a range of 9% to 13%.

4. The plasma processing method according to claim 1, wherein
   the halogen gas is chlorine gas, and
   the fluorine-containing gas is a nitrogen trifluoride gas.

5. The plasma processing method according to claim 1, wherein
   the silicon film containing boron is etched by supplying pulse-modulated radio frequency power to a sample table on which a sample formed with the silicon film containing boron thereon is placed, and
   when a product of the radio frequency power and a duty ratio during a pulse on period is 90 W, the duty ratio of the pulse is set to 25% or less.

6. The plasma processing method according to claim 1, wherein
   the silicon film containing boron is etched by setting a pressure in a processing chamber where the silicon film containing boron is plasma-etched to 2 Pa or less.

7. The plasma processing method according to claim 1, wherein
   a hard mask is formed by etching the silicon film containing boron.

8. The plasma processing method according to claim 4, wherein
   a hard mask is formed by etching the silicon film containing boron.

9. A plasma processing method for plasma etching a silicon film containing boron, the plasma processing method comprising:
   etching the silicon film containing boron by using a chlorine gas, a nitrogen trifluoride gas, a boron trichloride gas, and an oxygen gas.

10. A plasma processing method for plasma etching a silicon film containing boron, the plasma processing method comprising:
    etching the silicon film containing boron by using a chlorine gas, a nitrogen trifluoride gas, a boron trichloride gas, an oxygen gas, and a hydrogen bromide gas.

11. A plasma processing method for plasma etching a polysilicon film containing boron, the plasma processing method comprising:
    etching the polysilicon film containing boron by using a mixed gas of a halogen gas, a fluorine-containing gas, and a boron trichloride gas, wherein
    the halogen gas is at least one of a hydrogen bromide gas, a hydrogen chloride gas, and a hydrogen iodide gas.

12. The plasma processing method according to claim 11, wherein
    a flow rate ratio of the boron trichloride gas to a flow rate of the mixed gas is set to a ratio within a range of 9% to 13%.

13. The plasma processing method according to claim 11, wherein
    the fluorine-containing gas is a nitrogen trifluoride gas.

14. The plasma processing method according to claim 11, wherein
    the polysilicon film containing boron is etched by supplying pulse-modulated radio frequency power to a sample table on which a sample formed with the polysilicon film containing boron thereon is placed, and
    when a product of the radio frequency power and a duty ratio during a pulse on period is 90 W, the duty ratio of the pulse is set to 25% or less.

15. The plasma processing method according to claim 11, wherein
    the polysilicon film containing boron is etched by setting a pressure in a processing chamber where the polysilicon film containing boron is plasma-etched to 2 Pa or less.

16. The plasma processing method according to claim 11, wherein
    a hard mask is formed by etching the polysilicon film containing boron.

17. The plasma processing method according to claim 13, wherein
    a hard mask is formed by etching the polysilicon film containing boron.

18. A plasma processing method for plasma etching a polysilicon film containing boron, the plasma processing method comprising:
    etching the polysilicon film containing boron by using a chlorine gas, a nitrogen trifluoride gas, a boron trichloride gas, and an oxygen gas.

19. A plasma processing method for plasma etching a polysilicon film containing boron, the plasma processing method comprising:

etching the polysilicon film containing boron by using a chlorine gas, a nitrogen trifluoride gas, a boron trichloride gas, an oxygen gas, and a hydrogen bromide gas.

* * * * *